United States Patent [19]

Knecht

[11] 4,352,979

[45] Oct. 5, 1982

[54] UNIDIRECTIONAL REGISTER APPARATUS

[75] Inventor: Gene C. Knecht, Durham, N.C.

[73] Assignee: Westinghouse Electric Corp., Pittsburgh, Pa.

[21] Appl. No.: 219,096

[22] Filed: Dec. 22, 1980

[51] Int. Cl.³ .................... G06M 1/00; F16H 5/52; G01R 11/16; G01R 11/24

[52] U.S. Cl. .................................. 235/91 A; 74/812; 324/137; 324/153

[58] Field of Search ............... 235/91 R, 91 A; 74/8, 74/812; 324/137–138, 153

[56] References Cited

U.S. PATENT DOCUMENTS

| | | |
|---|---|---|
| Re. 11,961 | 1/1902 | Creveling .......................... 74/812 |
| 473,501 | 4/1892 | Fisher . |
| 504,132 | 8/1893 | Moskowitz et al. . |
| 599,508 | 2/1898 | Le Ferre ........................... 324/153 |
| 630,840 | 8/1899 | Aron ................................. 324/153 |
| 637,766 | 11/1899 | Creveling . |
| 683,279 | 9/1901 | Hochenegg . |
| 696,874 | 4/1902 | Lantz . |
| 825,791 | 7/1906 | Young ............................... 74/812 X |
| 954,672 | 4/1910 | Didierjean . |
| 993,766 | 5/1911 | Duenkel ........................... 235/91 R |
| 1,197,013 | 9/1916 | Cummings . |
| 1,262,772 | 4/1918 | Giliberti . |
| 1,563,742 | 12/1925 | Hansen . |
| 2,687,658 | 8/1954 | Nelson et al. ..................... 74/8 |
| 2,922,111 | 1/1960 | White ................................ 324/137 |

Primary Examiner—Richard A. Wintercorn
Assistant Examiner—Thomas H. Tarcza
Attorney, Agent, or Firm—Robert E. Converse, Jr.

[57] ABSTRACT

Unidirectional rotation of a register is produced by a ratchet assembly having a pivoting pawl member having two diverging wire segments, each of which discretely engages either of two sets of ratchet teeth. A transfer means couples input rotations of the rachet assembly in a false registering direction so as to produce rotations of the assembly output in a true registering direction.

5 Claims, 10 Drawing Figures

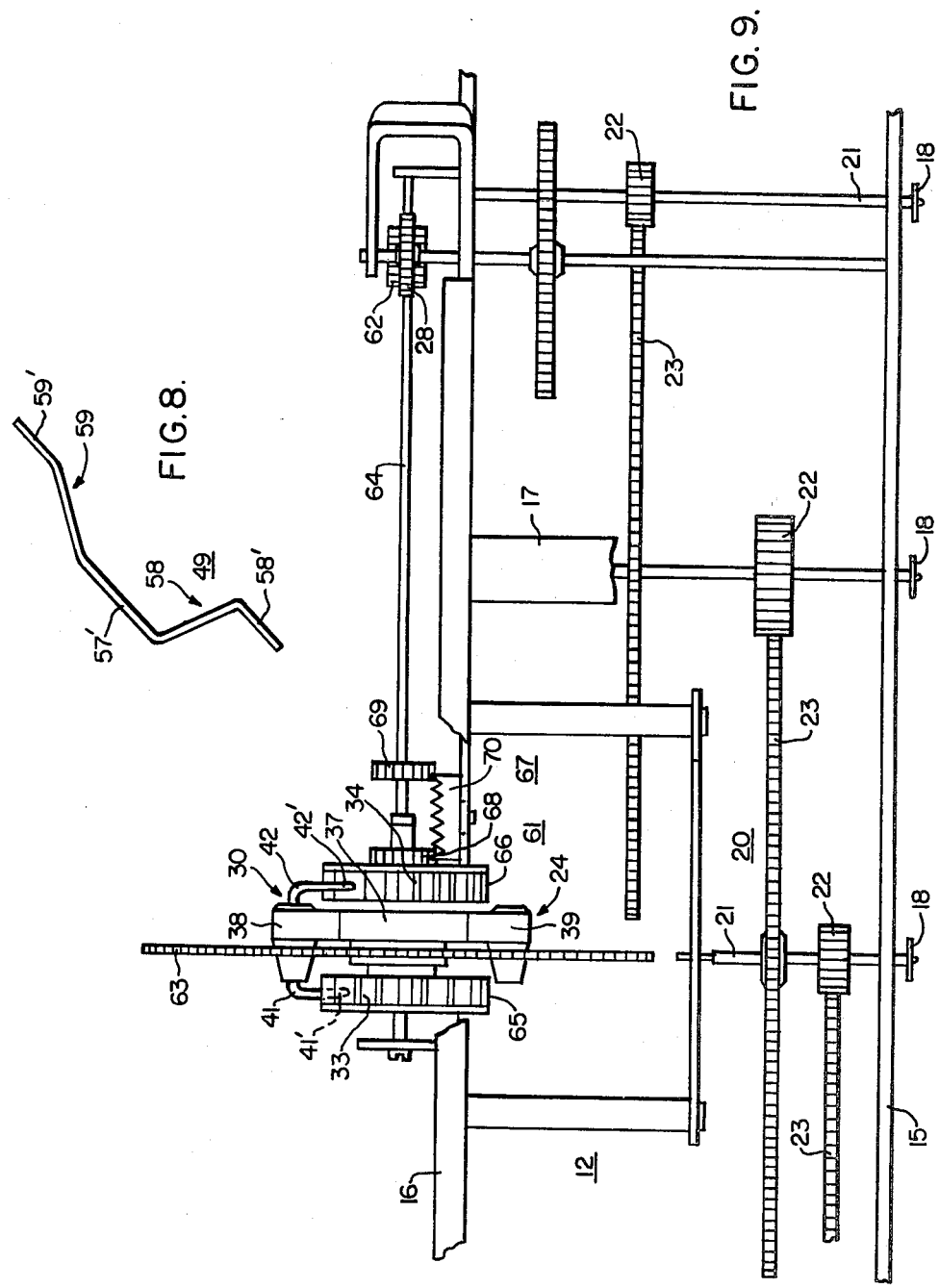

UNIDIRECTIONAL REGISTER APPARATUS

BACKGROUND OF THE INVENTION

1. Field of the Invention

This invention relates to dial register apparatus and more particularly to an improved pawl member and a ratchet assembly to convert a bidirectional rotational input to unidirectional rotation of the register apparatus.

2. Description of the Prior Art

Unidirectional register apparatus are designed to totalize and display the measured value of variable quantities such as the consumption of water, gas or electricity. Watthour meters include such apparatus for measuring and totalizing AC electric energy consumption. The present invention is of particular advantage in a watthour meter and preferred embodiments thereof are described for use in such a meter.

In a conventional watthour meter, voltage and current magnetic sections produce alternating magnetic fluxes responsive to the line voltage and line current. The fluxes rotate an electroconductive disc which is in driving relationship with a register. If the direction of rotation of the electroconductive disc is reversed from the direction that produces a true registration, then the registration provided prior to such reversal is reduced by the amount of such reversed rotation. In order to prevent such false registrations, it is well known to use a ratchet device for providing a unidirectional rotation of a prior art register in response to bidirectional rotation of the electroconductive disc. Such a ratchet device is disclosed in U.S. Pat. No. 2,922,111, assigned to the assignee of this invention. Unidirectional rotation of the register is maintained by a pair of separate and opposing pawl and ratchet wheel assemblies. The patent teaches that the width of each pawl is thick relative to its length.

It is also known to maintain unidirectional rotation by using a single pivotal pawl having two symmetrical ends wherein each pawl end engages one of two opposing sets of ratchet teeth. The engagement of a particular set of ratchet teeth depends upon the direction of rotation of the input. Such a device is disclosed in U.S. Pat. No. 825,791 wherein the width of the pawl is thick relative to its length. Furthermore, the pawl is not part of the driving member but is driven by the ratchet teeth adjacent the pawl.

In U.S. Pat. No. 2,687,658, an alternate embodiment uses a thin pivotal pawl to maintain unidirectional rotation from a bidirectional input by alternately engaging recesses in opposing drive members. The pawl is made of a torsional spring for maintaining its ends in an expanded position and for ensuring that its free end will engage a recess in the opposing drive member when the direction of rotation of the input is reversed.

When coupled with a register apparatus, none of the aforementioned prior art ratchet devices maintain unidirectional rotation as efficiently and reliably as the present invention.

SUMMARY OF THE INVENTION

In accordance with the present invention, a unidirectional register apparatus includes a dial register assembly having a gear train for rotating a plurality of dial indicators, the dial indicators displaying the totalized value of a measured quantity. The register apparatus further includes a ratchet assembly having a drive member, a first driven member, a second driven member, a rotatable input, a rotatable output, a drive shaft and a pawl member. The shaft-mounted rotatable output drives the register gear train and is in driving relationship with the first driven member. The first driven member and the second driven member are also mounted on the drive shaft with the drive member being mounted between them. The driven members have ratchet teeth disposed along their periphery. The pawl member has a connecting segment and two wire segments with the connecting segment pivotally attaching the two wire segments to the drive member. Each of the wire segments has an end portion which is disposed adjacent the ratchet teeth of one of the first and second driven members for maintaining mutually alternate released and engaged relationships in response to the opposite directions of rotation of the drive member. The rotatable input is carried about the drive shaft to receive the rotations to be totalized by the dial register assembly. The unidirectional register apparatus still further includes a means for transferring rotation received by the rotatable input in the false registration direction so that the rotation of the second driven member is transferred to the rotatable output to produce true totalizing registration.

There are at least two alternative mounting positions for the ratchet assembly. The assembly can be carried between the front and back plate of the register assembly or it can be carried outside and adjacent to the back plate. If it is carried between the front and back plate there will be less friction because some of the gear reduction between the ratchet assembly and the gear train is eliminated. However, it is easier to mount the ratchet assembly outside and adjacent to the back plate of the dial register included in a conventional watthour meter.

There are two embodiments of the ratchet assembly of the present invention. In one embodiment, the ratchet teeth of the assembly are radially disposed along the periphery of the driven members. The pawl member is pivotally attached to the periphery of the drive member at the connecting segment which is disposed in a slot parallel to the rotational axis of the drive shaft and has the wire segments diverging therefrom. Each end portion of a wire segment is bent to form a hook, the tips of the hooks being disposed adjacent the ratchet teeth of a driven member. The pawl member pivots so that each end portion moves in the same plane as does the ratchet teeth which are adjacently disposed. In a second embodiment, the ratchet teeth are disposed in facing relationship along the periphery of the driven members in planes perpendicular to radii drawn from the axes of the driven members. The pawl member is attached to the periphery of the drive member at the connecting segment which is disposed transverse to the rotational axis of the drive shaft and has the wire segments diverging therefrom. The end portions of the wire segments are disposed adjacent the ratchet teeth of the driven members with each end portion bent in an L-shape. The pawl member pivots so that the wire segments move between the facing ratchet teeth of the first and second driven members.

A general feature of the present invention is to provide a unidirectional register that is inexpensive and simple to manufacture.

A further feature of the present invention is to improve the speed of response of a unidirectional output of a register when the direction of a register input is reversed, thus reducing the loss of registration.

A still further feature of the present invention is to reduce the torque transmission losses that result when the direction of the input is reversed. These and other advantages and features of the present invention will be apparent from the detailed description of the invention illustrated in the drawings briefly described hereinafter.

BRIEF DESCRIPTION OF THE DRAWINGS

FIG. 8 is a separate perspective view of the pawl member shown in FIGS. 5, 6 and 7;

FIG. 9 is a top view of a unidirectional register apparatus, having a ratchet assembly similar to the assembly of FIG. 2 disposed adjacent the back plate of a dial register assembly, with parts removed.

DESCRIPTION OF THE PREFERRED EMBODIMENT

Figure 1:
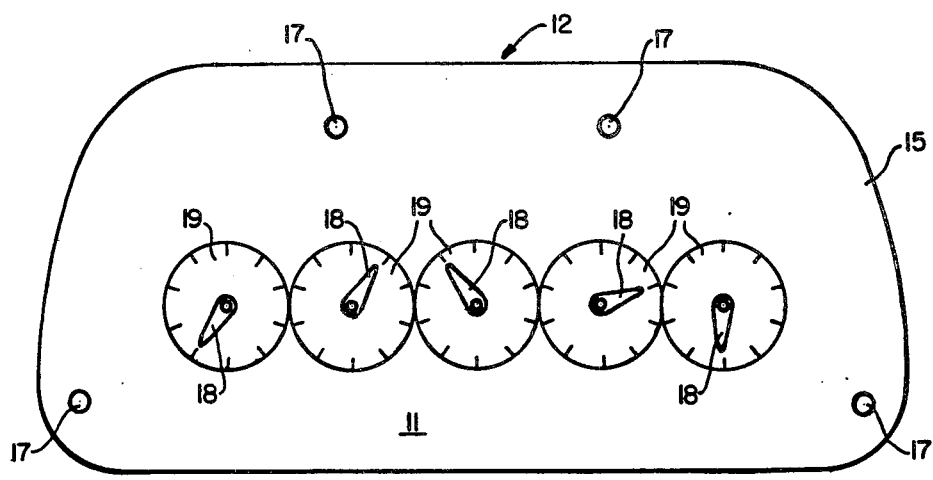
FIG. 1 is a front plan view of a unidirectional register apparatus, the apparatus made in accordance with a preferred embodiment of the present invention.

Referring now to the drawings and more particularly to FIGS. 1, 2, 3 and 4, there is shown a preferred embodiment of a unidirectional register apparatus 11 for totalizing the value of a measured quantity. In general, the register apparatus 11 includes a dial register assembly 12, a ratchet assembly 13, and a transfer means 14.

Figure 2:
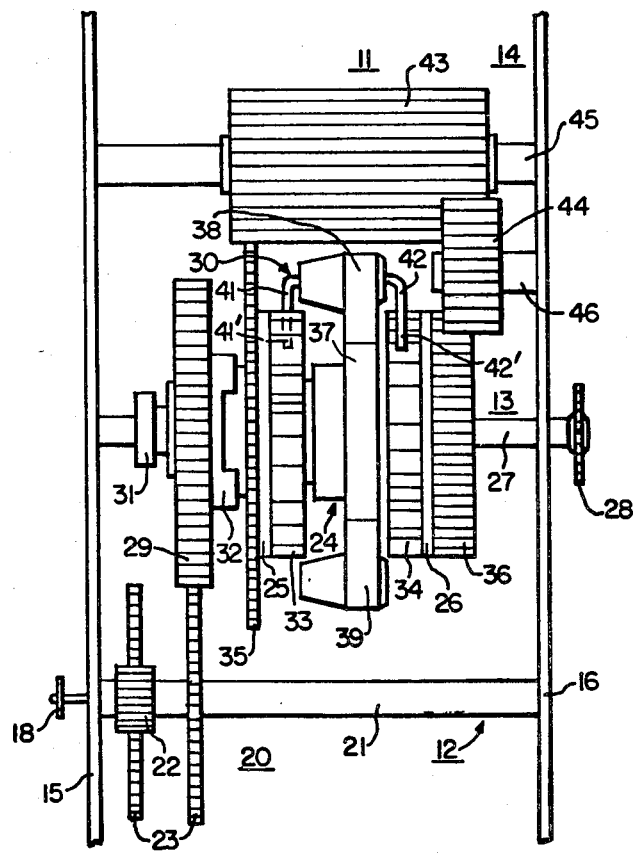
FIG. 2 is a side plan view of the apparatus shown in FIG. 1, with parts removed.

As shown in FIGS. 1 and 2, the dial register assembly 12 includes a front plate 15 fastened to a back plate 16 by spacer studs 17, with dial indicators 18 sweeping across the face of dials 19 which are disposed on the front plate 15. Between the front plate 15 and the back plate 16 is a gear train 20 carried on indicator shafts 21, the shafts 21 rotating the dial indicators 18 across the face of the dials 19. The gear train 20 includes pinion gears 22 and indicator gears 23. The pinion gear 22 carried on each indicator shaft 21 is meshed with an indicator gear 23 carried on the adjacent indicator shaft 21 for transferring rotation in a decade-related fashion. The indicator shaft 21 corresponding to the lowest order of the decade related dials 19 carries the indicator gear 23 meshed with the ratchet assembly 13.

The ratchet assembly 13 shown in FIG. 2 is carried for rotation between the front plate 15 and the back plate 16 and includes a drive member 24, a first driven member 25, a second driven member 26, a drive shaft 27, a rotatable input such as an input gear 28, a rotatable output such as an output gear 29 and a pawl member 30. The input gear 28 is engaged to be driven by a means, not shown, responsive to the value of a quantity being measured, so that the rotations of the gear 28 are totalized by the register assembly 12. It is contemplated that this driving means includes a disc shaft driven by the voltage and current magnetic sections of a conventional watthour meter. The output gear 29 is carried loosely to idle on the drive shaft 27 and is meshed with the indicator gear 23 of the shaft corresponding to the lowest order of the decade-related dials, thus coupling the ratchet assembly 13 with the gear train 20. A shaft collar 31 prevents axial movement of the output gear 29. The output gear 29 is fixedly coupled to the first driven member 25 by a removable connection such as a hub 32, allowing replacement of the output gear 29 for creating alternative gear ratios for accommodating registers having different meter constants. The first driven member 25 and the second driven member 26 are loosely carried for free rotation on the drive shaft 27, with the drive member 24 being fixedly carried on the drive shaft 27 between them. Each of the driven members 25 and 26 have a set of peripheral ratchet teeth 33 and 34, respectively, which are radially disposed and further have a set of peripheral gear teeth 35 and 36, respectively, which are also radially disposed.

Figure 4:
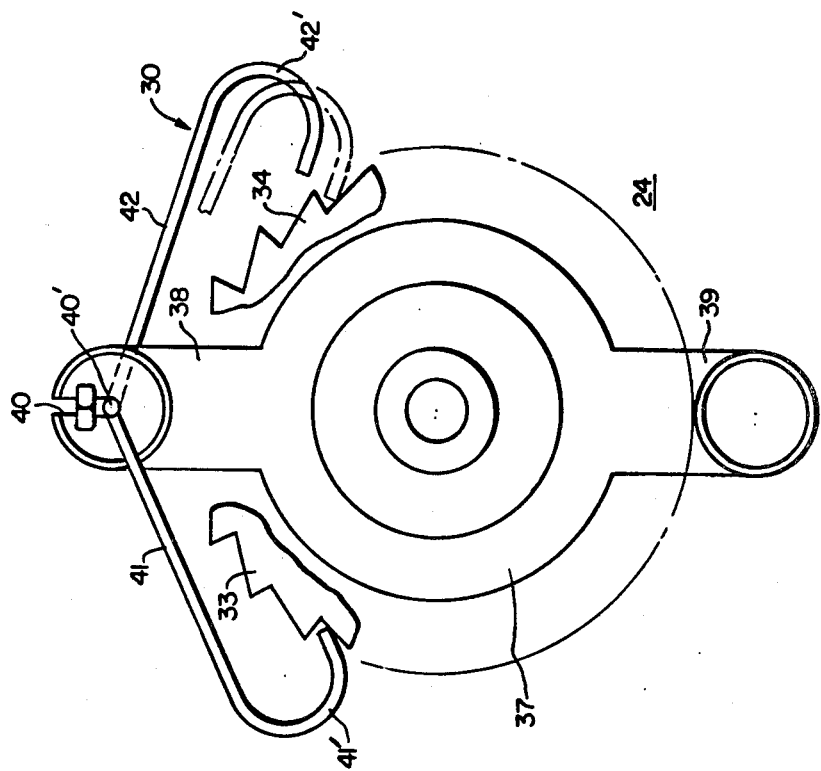
FIG. 4 is an end view of the drive member, pawl member and ratchet teeth shown in FIG. 2 and illustrating the two operative positions of the pawl member.
Figure 3:
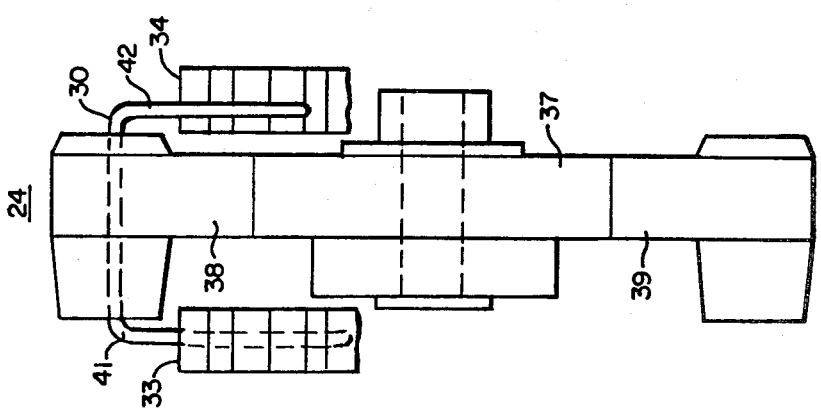
FIG. 3 is a separate view of the drive member, pawl member and adjacent ratchet teeth shown in FIG. 2.
Figure 5:
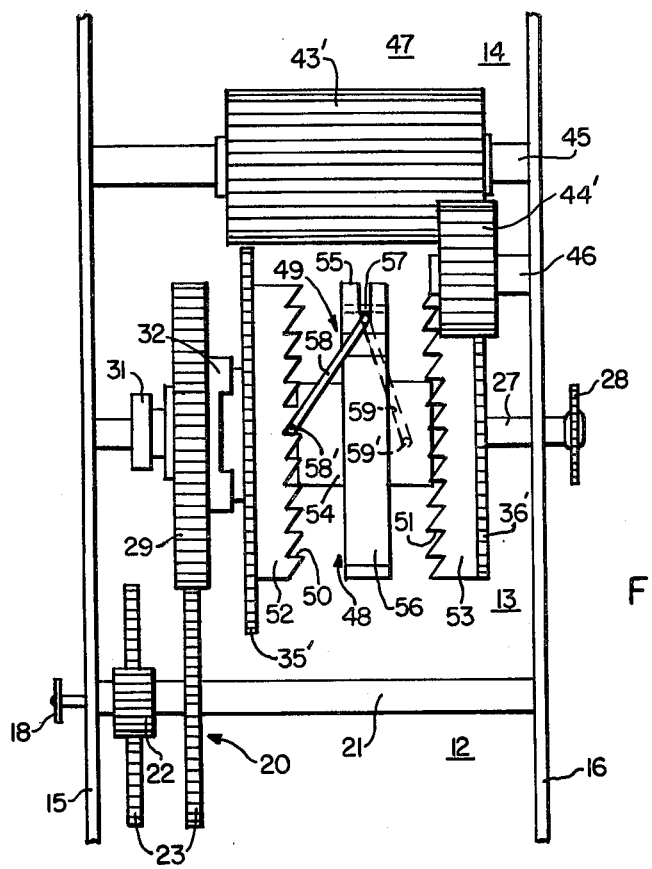
FIG. 5 is a side plan view of a unidirectional register apparatus corresponding to the side plan view of FIG. 2, illustrating a second preferred embodiment of the present invention.

FIGS. 3 and 4 show separate views of the drive member 24, the pawl member 30 and some of the ratchet teeth 33 and 34. The drive member 24 has a circular central portion 37 and two radially extending symmetrical arms 38 and 39. The pawl member 30 has a connecting segment 40' and two wire segments 41 and 42 diverging from the ends thereof. The arm 38 has a slot 40 parallel to the rotational axis of the drive shaft 27 in which the pawl member 30 is pivotally attached by the connecting segment 40'. Each of the wire segments 41 and 42 has an end portion 41' and 42' bent to form the shape of a hook. The end portion 41' is adjacent to the ratchet teeth 33 and the end portion 42' is adjacent to the ratchet teeth 34. It is contemplated that the wire segments 41 and 42 and the connecting segment 40' be formed from one continuous segment of piano wire with a diameter of 0.010 inch (0.025 cm).

The end portions 41' and 42' of the wire segments 41 and 42 are disposed for mutually alternate released and engaged relationships with the ratchet teeth 33 and 34, respectively. To produce these relationships, the wire segments 41 and 42 pivot as a unit, each of the end portions 41' and 42' cooperatively moving in the same plane which the adjacently disposed ratchet teeth rotate in. The distance between the tips of the end portions 41' and 42' is greater than the distance between the outermost edges of the ratchet teeth 33 and 34 adjacent the end portions so that when one of the end portions is engaged with the ratchet teeth adjacent that end portion the other end portion is held clear of the other ratchet teeth. The ratchet teeth 33 and 34 are aligned so that the rotation of the drive member 24 in a first direction engages the ratchet teeth 33 with the end portion 41' while the rotation of the drive member 24 in a second and opposite direction engages the ratchet teeth 34 with the end portion 42'.

Referring now to FIG. 2, there is shown the transfer means 14 including a first transfer gear 43 and a second transfer gear 44, each gear freely rotating on the corresponding gear shafts 45 and 46. The first transfer gear 43 is meshed with the gear teeth 35 of the first driven member 25 and is further meshed with the second transfer gear 44. The second transfer gear 44 is meshed with the gear teeth 36 of the second driven member 26.

The operation of the apparatus 11 shown in FIG. 2 will now be described. A driving means, not shown, which responds to the value of the quantity being measured, rotates the input gear 28, and the drive shaft 27 upon which the input gear 28 is carried, in either a first direction which produces true registration of the register assembly 12 or in a second and false registration direction. Either input rotation is transferred by the drive shaft 27 to the fixedly carried drive member 24. If the drive member 24 is rotated in the first direction, which is clockwise as viewed in FIG. 4, the end portion 41' will engage the ratchet teeth 33, causing rotation of the first driven member 25 in the same direction. This rotation will be transferred by the hub 32 to the output gear 29, thus driving the indicator gear 23 and the rest of the gear train 20 to produce true registration of the dial register assembly 12. Simultaneously, rotation of the first driven member 25 is transferred through the gear teeth 35, the transfer gears 43 and 44 and the gear teeth 36 to rotate the second driven member 26 in the second direction. However, since the end portion 42' is held free of the ratchet teeth 34, the second driven member 26 idles and does not affect the rotation of the drive member 24.

When the rotation imparted by the driving means, not shown, to the input gear 28 and the drive shaft 27 is reversed, the drive member 24 rotates in the second direction which is counterclockwise as viewed in FIG. 4. The inclined teeth 33 of the first driven member 25 cams the end portion 41' of the wire segment 41 out of engagement and pivots the pawl member 30. An inclined tooth 34 of the second driven member 26 then cams the end portion 42' of the wire segment 42 into engagement. Further rotation of the drive member 24 effects rotation of the second driven member 26 in the second direction. This rotation is transferred from the gear teeth 36 to the second transfer gear 44, the first transfer gear 43 and to the gear teeth 35, causing the rotation of the first driven member 25 in the first direction of rotation. The rotation of the first driven member 25 is transmitted to the hub 32, to the output gear 29, to the indicator gear 23 and to the gear train 20, effecting the same true registration of the dial register assembly 12.

The operation of the present invention described hereinabove illustrates an important advantage of using a wire pawl member 30 to mechanically transmit the rotational torque of the drive member 24 to either the driven member 25 or to the driven member 26. Since the wire is lightweight it has low inertia and thus pivots quickly between the two driven members 25 and 26. This improves the speed of response of the register apparatus 12 when the direction of rotation of the input gear 28 is reversed, reducing loss of registration. Furthermore, since the pivoting wire has a small diameter, this reduces the surface contact area. Thus, the torque transmitting losses due to friction are diminished.

Another preferred embodiment of a unidirectional register apparatus 47 is shown in FIGS. 5, 6, 7 and 8. The same numerals are used to indicate the same or substantially similar elements as shown in FIGS. 1, 2, 3 and 4. In this second embodiment, the ratchet assembly 13 is also carried for rotation between the front plate 15 and the back plate 16 of the dial register assembly 12 and is coupled to the indicator gear 23 and the transfer means 14.

Figure 7:
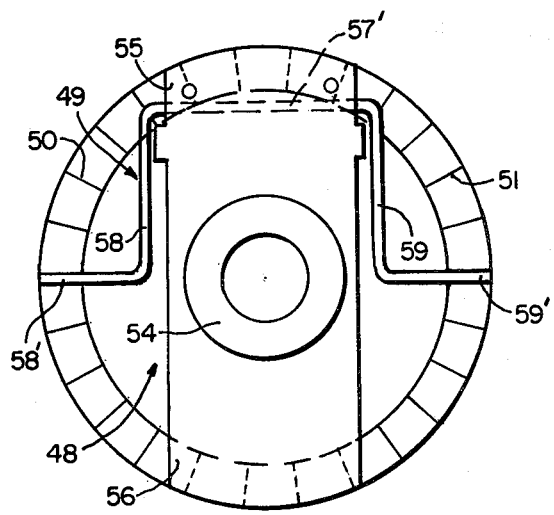
FIG. 7 is an end view of the drive member, pawl member and ratchet teeth shown in FIG. 6.
Figure 6:
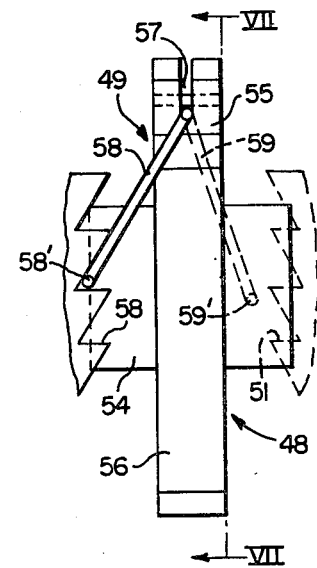
FIG. 6 is a separate view of the drive member, pawl member and adjacent ratchet teeth shown in FIG. 5.

The important difference between the apparatus 47 and the previously described apparatus 11 is the construction of a drive member 48, a pawl unit 49 and ratchet teeth 50 and 51 of a first driven member 52 and a second driven member 53, respectively. These elements are illustrated in FIGS. 6 and 7, the pawl unit 49 being separately illustrated in FIG. 8. The ratchet teeth 50 and 51 are mutually facing and are disposed along the periphery of the first driven member 52 and the second driven member 53 in planes perpendicular to radii from the center axes of these members. The drive member 48 has a cylindrical central portion 54 with two symmetrical radially disposed arms 55 and 56. The arm 55 has a slot 57 in one end transverse to the rotational axis of the shaft 27 in which the pawl unit 49 is pivotally attached.

The pawl unit 49, which is separately illustrated in FIG. 8, has a connecting segment 57' and two wire segments 58 and 59 diverging from the ends thereof. Each of the wire segments 58 and 59 has an end portion 58' and 59', respectively, bent in an L-shape.

The end portions 58' and 59', as in the previously described apparatus 11, are disposed for mutually alternate released and engaged relationships with the ratchet teeth 50 and 51. The pawl member 49 is again formed of a continuous small diameter wire. The connecting segment 57' pivots in the slot 57, the wire segments 58 and 59 cooperatively moving between the facing ratchet teeth 50 and 51. The distance between the tips of the end portions 58' and 59' is less than the distance between the outermost edges of the ratchet teeth 50 and 51 adjacent the end portions so that when one of the wire segments is engaged with the ratchet teeth adjacent that wire segment, the other wire segment is held clear of the other ratchet teeth. The ratchet teeth 50 and 51 are aligned so that the rotation of the drive member 48 in a first true registering direction engages the ratchet teeth 50 with the portion 58' of the wire segment 58 while the rotation of the drive member 48 in a second and opposite direction engages the ratchet teech 51 with the end portion 59' of the wire segment 59.

The operation of the apparatus 47 is substantially similar to the operation of the previously-described apparatus 11. Rotation imparted to the input gear 28 and the input shaft 27 by a driving means rotates the fixedly carried drive member 48 in either the first or second direction of rotation. If the imparted rotation is in the first direction that produces true registration, which is clockwise as viewed in FIG. 7, the end of the wire segment 58 engages the ratchet teeth 50, rotating the first driven member 52. This rotation is transmitted by the output gear 29 to rotate the indicator gear 12 and the gear train 20 in the direction that effects true registration. As in the previously-described apparatus 11, the rotation of the first driven member 52 in the first direction is imparted through the transfer means 14 to idle the second driven member 53 in the opposite direction, free from engagement with the pawl member 49.

When the direction of rotation of the drive shaft 27 is reversed, the inclined teeth 50 of the first driven member 52 cams the end portion 58' of the wire segment 58 out of engagement and pivots the pawl member 49. An inclined tooth 51 of the second driven member 53 then cams the end portion 59' of the wire segment 59 into engagement. This rotation in the second direction, which is counterclockwise as viewed in FIG. 7, is transferred from the gear teeth 36' of the second driven member 53 through the transfer gears 44 and 43 to the gear teeth 35' rotating the first driven member 52 in the first direction of rotation. The rotation of the first driven member 52 is transferred through the hub 32 and the output gear 29 to drive the indicator gear 23 and the gear train 20, effecting true registration of the dial register assembly 12.

Figure 10:
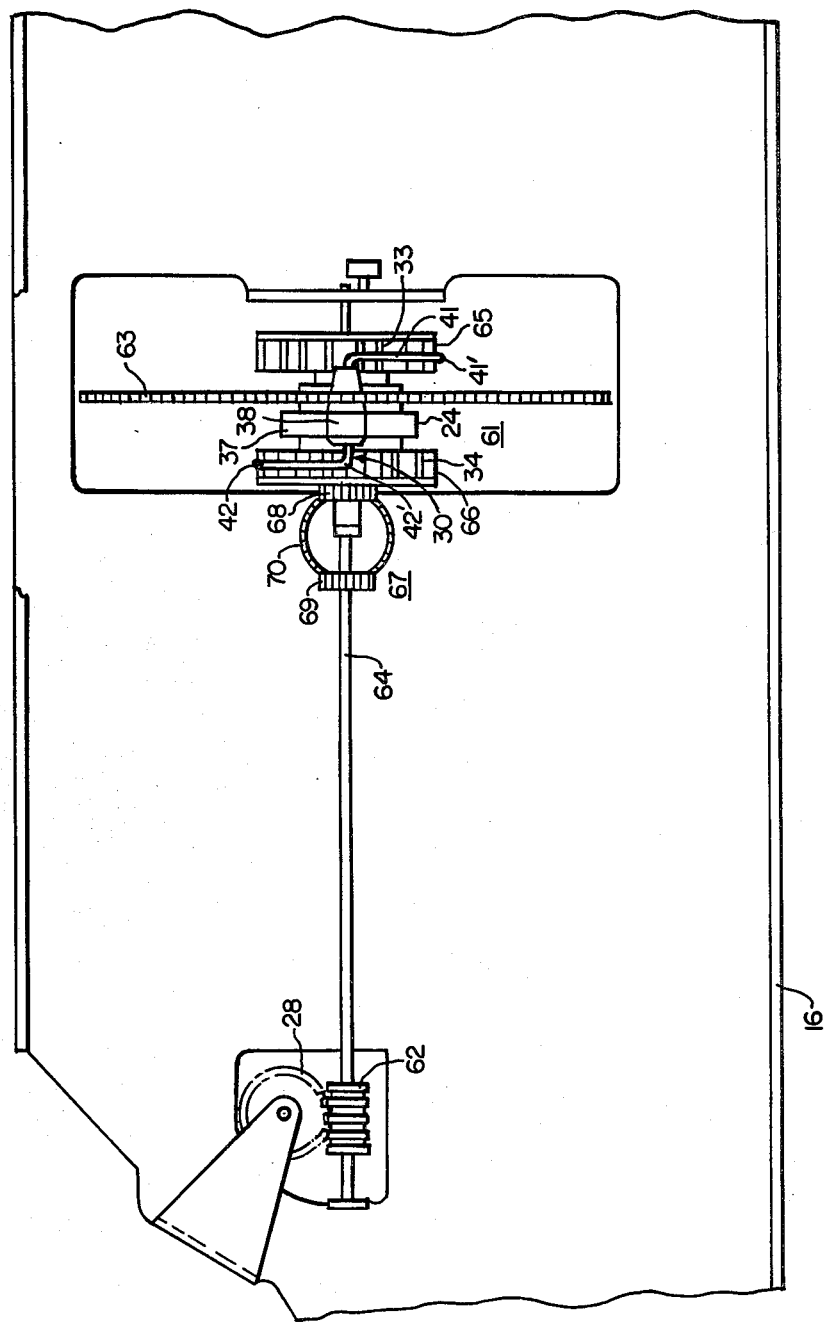
FIG. 10 is a back view of the apparatus shown in FIG. 9.

Another preferred embodiment of a unidirectional register apparatus 60 made in accordance with this invention is shown in FIGS. 9 and 10. The same numerals are used to indicate the same or substantially similar elements as shown in FIGS. 1, 2, 3 and 4. In this third embodiment, a ratchet assembly 61 is disposed adjacent the outside of the back plate 16 of the register assembly 12. The ratchet assembly 61 includes a rotatable output 62, a rotatable input 63, a drive shaft 64, a first driven member 65, a second driven member 66, the drive member 24, and the pawl member 30. The rotatable output 62 is fixedly carried on the drive shaft 64 and is in driving relationship with the input gear 28 of the dial register assembly 12. The first driven member 65 is fixedly carried on the drive shaft 64, while the second driven member 66 idles and is loosely carried on the drive shaft 64. Each of the driven members 65 and 66 have radially disposed ratchet teeth 33 and 34. The drive member 24 is loosely carried on the drive shaft 64 between the driven members 65 and 66. The rotatable input 63 is fixedly carried on the drive member 24 and is engaged by a driving means, not shown. Although the drive member 24, the pawl member 30 and the ratchet teech 33 and 34 are shown as formed in accordance with FIGS. 3 and 4, they may also be formed in accordance with FIGS. 6, 7 and 8.

To allow the ratchet assembly 61 to be easily mounted on the back plate 16 of a conventional dial register assembly 12, a transfer means 67 is of a different construction than the transfer means 14 of the previously described apparatus 11 and 47. The transfer means 67 includes a first transfer gear 68, a second transfer gear 69 and a crown gear 70. The first transfer gear 68 is loosely carried on the drive shaft 64 and is fixedly coupled with the second driven member 66. The second transfer gear 69 is fixedly carried on the drive shaft 64. The crown gear 70 is meshed with the first transfer gear 68 and the second transfer gear 69 and is mounted for rotation on the back plate 16, the rotational axis of the crown gear 70 being transverse to the rotational axis of the drive shaft 24.

The operation of the apparatus 60 will now be described. A driving means, not shown, which responds to the value of the quantity being measured, rotates the rotatable input 63 in either a first or second direction of rotation. This rotation is transferred to the fixedly attached drive member 38. If the rotation is in the first direction that produces true registration, the pawl member 30 engages the ratchet teeth 33 of the first driven member 65 as previously described in the apparatus 11. This rotation is transferred to the rotatable output 62 through the drive shaft 64. The rotatable output 62 turns the input gear 28. The input gear 28 drives the gear train 20 and the dial indicators 18, effecting true registration of the dial register assembly 12. Simultaneously, the rotation of the drive shaft 64 causes the transfer means 67 to rotate the second driven member 66 in a second and opposite direction. However, since the end portion 42' is held free of the ratchet teech 34, the second driven member 66 idles and does not affect the rotation of the drive member 24.

When the driving means, not shown, rotates the rotatable input 63 in the second and opposite direction of rotation, the end portion 42' wire segment 42 engages the ratchet teet 34 of the second driven member 66. The second driven member 66 rotates the loosely carried first transfer gear 68, causing the crown gear 70 to rotate the fixedly carried second transfer gear 69 in the first direction of rotation. This rotation is translated and torque is transferred along the drive shaft 64 and through the rotatable output 62 to drive the input gear 28 and the gear train 20 in a true registering fashion as described hereinbefore. Simultaneously, the drive shaft 64 effects rotation of the fixedly carried first driven member 65, which idles free from engagement with the pawl member 30.

The unidirectional register apparatus described hereinabove provides an efficient and simple method of converting a bidirectional rotational input to the unidirectional rotation of totalizing dial indicators of a register. It is contemplated that modifications and changes to the preferred embodiments will be apparent to those skilled in the art without departing from the spirit and scope of the invention.

I claim:

1. A unidirectional register apparatus for maintaining true totalizing registration comprising:
   a dial register assembly including a front plate, a back plate, a gear train and a plurality of dial indicators, said gear train being carried for rotation between said front plate and said back plate and coupling said dial indicators adjacent said front plate;
   a ratchet assembly including a drive shaft, a rotatable input means carried about on said shaft with the rotations thereof being totalized by said dial register assembly and a rotatable output means mounted on said shaft in driving engagement with said gear train of said dial register assembly, said ratchet assembly further including a drive member mounted on said drive shaft in driving engagement with said rotatable input means and first and second driven members mounted on said drive shaft on opposite sides of said drive member, each of said first and second driven members having ratchet teeth disposed at the periphery thereof with said first driven member being in driving engagement with said rotatable output means, said ratchet assembly still further including a pawl member pivotally mounted on the periphery of said drive member having first and second diverging wire segments, each of said first and second wire segments including an end portion disposed on opposite sides of said drive shaft for mutually alternate released and engaged relationships with the ratchet teeth of said first and second driven members respectively in response to the opposite directions of rotation of said drive member where upon rotation of said drive member in a first direction effects the ratchet teeth engagement of said first wire segment with said first driven member for driving said rotatable output means in a true registering direction; and
   means transferring rotation from said second driven member to said rotatable output means for rotation in said true registering direction when rotation of said drive member is in a second and opposite direction that effects ratchet teeth engagement of said second wire segment with said second driven member.

2. A unidirectional register apparatus as claimed in claim 1 wherein each end portion of each of said diverging wire segments is bent to form the shape of a hook, the distance between the tips of said end portions being greater than the distance between the outermost edges of said ratchet teeth adjacent said portions, said ratchet teeth being radially disposed from the axes of said first driven member and said second driven member.

3. A unidirectional register apparatus as claimed in claim 1 wherein said ratchet teeth are in facing relationship, being disposed along the circumferences of said first and said second driven members in planes perpendicular to radii from the axes of said driven members, each of the end portions of said diverging wire segments being bent to form an L-shape, the distance between the tips of said end portions being less than the distance between the outermost edges of said ratchet teeth adjacent said end portions.

4. A unidirectional register apparatus for maintaining true totalizing registration comprising:
   a dial register assembly including a front plate, a back plate, a gear train and a plurality of dial indicators, said gear train being carried for rotation between said front plate and said back plate and coupling said dial indicators adjacent said front plate;
   a ratchet assembly carried for rotation between said front plate and said back plate and including a drive shaft, a rotatable input fixedly mounted on said drive shaft with the rotations thereof being totalized by said dial register assembly and a rotatable output loosely mounted on said shaft in driving engagement with said gear train of said dial register assembly, said ratchet assembly further including a drive member fixedly mounted on said drive shaft for rotation by said rotatable input means and first and second driven members loosely mounted for idling rotation on said drive shaft on opposite sides of said drive member, each of said driven members having ratchet teeth disposed at the periphery thereof and further having peripheral gear teeth with said first driven member being fixedly coupled with said rotatable output, said ratchet assembly still further including a pawl member formed from a small diameter continuous wire, said pawl member having a connecting segment pivotally mounted parallel to said drive shaft on the periphery of said drive member and further having first and second wire segments at the ends of said connecting segment, said first and second wire segments each including an end portion which is formed in the shape of a hook and disposed on opposite sides of said drive shaft adjacent the ratchet teeth of said first and second driven members respectively for mutually alternate released and engaged relationships therewith in response to the opposite directions of rotation of said drive member whereupon rotation of said drive member in a first direction effects the ratchet teeth engagement of said first wire segment with said first driven member for driving said rotatable output in a true registering direction; and
   a transfer means including a first transfer gear and a second transfer gear, said first transfer gear meshed with the gear teeth of said first driven member, said second transfer gear meshed with said first transfer gear and further meshed with the gear teeth of said second driven member so that said first driven member and said rotatable output are rotated in said true registering direction when rotation of said drive member is in a second and opposite direction that effects the ratchet teeth engagement of said second wire segment with said second driven member, said second driven member being rotated by said transfer means free from engagement with said second wire segment when said drive member is rotated in said first direction.

5. A unidirectional register apparatus for maintaining true totalizing registration comprising:
   a dial register assembly including a front plate, a back plate, a gear train, a plurality of dial indicators and an input gear, said gear train being carried for rotation between said front plate and said back plate and coupling said dial indicators adjacent said front plate, said input gear disposed at said back plate and being in driving relationship with said gear train;
   a ratchet assembly carried for rotation adjacent said back plate and including a drive shaft, a rotatable input carried about said drive shaft with the rotations thereof being totalized by said dial register assembly and a rotatable output fixedly mounted on said shaft and coupled to said input gear for driving engagement with the gear train of said dial register assembly, said ratchet assembly further including a drive member loosely mounted on said drive shaft and fixedly coupled with said rotatable input for rotation therewith, said ratchet assembly still further including a first driven member fixedly mounted on said drive shaft on one side of said drive member for driving engagement with said fixedly mounted rotatable output and a second driven member loosely mounted on said drive shaft on the opposite side of said drive member, each of said driven members having ratchet teeth disposed at the periphery thereof, said ratchet assembly still further including a pawl member formed from a small diameter continuous wire, said pawl member having a connecting segment pivotally mounted parallel to said drive shaft on the periphery of said drive member and further having first and second wire segments at the ends of said connecting segment, said first and second wire segments each including an end portion which is formed in the shape of a hook and disposed on opposite sides of said drive shaft adjacent the ratchet teeth of said first and second driven member respectively for mutually alternate released and engaged relationships therewith in response to the opposite direction of rotation of said drive member whereupon rotation of said drive member in a first direction effects the ratchet teeth engagement of said first wire segment with said first driven member for driving said rotatable output in a true registering direction; and
   a transfer means including a first transfer gear and a second transfer gear, said first transfer gear freely mounted on said drive shaft and fixedly coupled with said second driven member, said second transfer gear fixedly mounted on said drive shaft for driving engagement with said fixedly mounted rotatable output, said transfer means further including a crown gear disposed on said back plate and meshed with said first transfer gear and said second transfer gear so that said second transfer gear effects rotation of said rotatable output in said true registering direction when rotation of said drive member is in a second opposite direction that effects the ratchet teeth engagement of said second wire segment with said second driven member, said second driven member being freely rotated by said transfer means free from engagement with said second wire segment when said drive member is rotated in said first direction.

* * * * *